(12) United States Patent
Chen

(10) Patent No.: US 9,178,183 B2
(45) Date of Patent: Nov. 3, 2015

(54) ORGANIC LIGHT EMITTING DIODE DISPLAY PANEL AND METHOD FOR MANUFACTURING THE SAME

(71) Applicant: BOE TECHNOLOGY GROUP CO., LTD., Beijing (CN)

(72) Inventor: Haijing Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/878,020

(22) PCT Filed: Oct. 17, 2012

(86) PCT No.: PCT/CN2012/083100
§ 371 (c)(1),
(2) Date: Apr. 5, 2013

(87) PCT Pub. No.: WO2013/170581
PCT Pub. Date: Nov. 21, 2013

(65) Prior Publication Data
US 2014/0097413 A1 Apr. 10, 2014

(30) Foreign Application Priority Data
May 18, 2012 (CN) .......................... 2012 1 0157391

(51) Int. Cl.
*H01L 51/40* (2006.01)
*H01L 51/56* (2006.01)
*H01L 27/32* (2006.01)

(52) U.S. Cl.
CPC ............ *H01L 51/56* (2013.01); *H01L 27/3246* (2013.01)

(58) Field of Classification Search
CPC ..... H01L 21/0274; H01L 21/32; H01L 27/32; H01L 27/3244; H01L 51/50; H01L 51/56
USPC ................. 257/59, 72, 40, E27.131, E27.132, 257/E51.001, E51.022; 438/22, 28, 29, 34, 438/99, 694, 708
See application file for complete search history.

(56) References Cited

U.S. PATENT DOCUMENTS 7,247,986 B2 * 7/2007 Kang et al. ..................... 313/512
8,018,141 B2 * 9/2011 Kim .............................. 313/504
(Continued)

FOREIGN PATENT DOCUMENTS

CN 1770465 A 5/2006
CN 1845310 * 10/2006 ............ H01L 21/768
(Continued)

OTHER PUBLICATIONS

First Chinese Office Action dated Oct. 31, 2013; Appln. No. 201210157391.9.
(Continued)

*Primary Examiner* — Galina Yushina
(74) *Attorney, Agent, or Firm* — Ladas & Parry LLP

(57) ABSTRACT

Embodiments of the present invention provide an organic light emitting diode display panel and a method for manufacturing the same. The manufacturing method comprises: coating a photoresist layer on a transparent substrate with an active array formed; performing exposure on the photoresist layer from one side of the transparent substrate opposed to the photoresist layer, where the scan lines and the at least one kind of lines are used as a mask to prevent exposure of the corresponding photoresist, so that a photoresist remaining region is formed by the photoresist layer; conducting a development treatment on the photoresist layer, so that the photoresist outside the photoresist remaining region is removed and the photoresist in the photoresist remaining region is retained to form the pixel defining layer. The embodiments of the invention may simplify the fabricating flow of the display panel, reduce production costs of the display panel, and increase yield of the display panel.

9 Claims, 3 Drawing Sheets

(56) References Cited

U.S. PATENT DOCUMENTS

| | | | |
|---|---|---|---|
| 2004/0145560 A1 | 7/2004 | Kim | |
| 2004/0266039 A1 | 12/2004 | Ahn et al. | |
| 2006/0049753 A1* | 3/2006 | Kang et al. | 313/506 |
| 2007/0096613 A1* | 5/2007 | Shin et al. | 313/112 |
| 2013/0001565 A1* | 1/2013 | Jung et al. | 257/59 |

FOREIGN PATENT DOCUMENTS

| | | |
|---|---|---|
| CN | 1845310 A | 10/2006 |
| CN | 101067705 A | 11/2007 |
| CN | 101393388 A | 3/2009 |
| CN | 102709243 A | 10/2012 |
| JP | 6-051490 A | 2/1994 |
| JP | 06051490 A | 2/1994 |
| KR | 20040067579 | 7/2004 |
| TW | 200827783 A | 7/2008 |

OTHER PUBLICATIONS

Chinese Rejection Decision dated Mar. 14, 2014; Appln. No. 201210157391.9.

First Korean Office Action dated Feb. 28, 2014; Appln. No. 10-2013-7011439.

Korean Notice of Allowance Appln No. 10-2013-7011439; Dated Sep. 25, 2014.

International Preliminary Report on Patentability Appln. No. PCT/CN2012/083100; Dated Nov. 18, 2014.

International Search Report dated Feb. 28, 2013; PCT/CN2012/083100.

* cited by examiner

ORGANIC LIGHT EMITTING DIODE DISPLAY PANEL AND METHOD FOR MANUFACTURING THE SAME

TECHNICAL FIELD

Embodiments of the present invention relate to an organic light emitting diode display panel and a method for manufacturing the same.

BACKGROUND

An organic light-emitting diode (OLED) display panel is generally formed with a stacked structure of a glass substrate, an indium tin oxide (ITO) anode, an organic light emitting layer (emitting material layer), a cathode and so on. The organic light emitting layer is sandwiched between the ITO anode, which is thin and transparent, and the metal cathode. When holes from the anode and electrons from the cathode combine in the organic light emitting layer, the organic material in the organic light emitting layer will be excited to emit light. Active matrix organic light-emitting diode (AMOLED) display panels are a kind of OLED display panels. Compared to conventional liquid crystal display panels, AMOLED panels have characteristics of faster response speed, higher contrast, wider viewing angle, etc., and have wide application prospective.

A conventional manufacturing process for an OLED display panel may broadly include the following two steps:

1. An active matrix is formed on a substrate.
2. An array of organic light emitting devices is produced and packaged, wherein the organic light emitting devices include ITO anodes, a pixel defining layer on the anodes, organic electroluminescent layers and cathodes.

The organic electroluminescent layers are sandwiched between the anodes and the cathodes to form a sandwich structure. The pixel defining layer acts to define the size of pixels and the anodes, and to ensure insulation between the anodes and the cathodes.

FIG. 1 is a structurally schematic view showing an active-region pixel prior to fabrication of a pixel defining layer in prior art. In the figure, 101a~101b denote scan lines, 102a~102b denote data lines, 105a denotes a driving power line; 109 denotes a switch transistor; 110 denotes a driving transistor; 103a denotes an active area, which is formed of a semiconductor material, such as monocrystalline silicon, polysilicon, indium gallium zinc oxide (IGZO), etc.; 104a denotes a connecting line for connecting the switch transistor 109 and the driving transistor 110; and 106a denotes a transparent electrode. Based on FIG. 1, FIG. 2 is a structurally schematic view further showing the pixel defining layer. The region 107a in FIG. 2 is the pixel defining layer within one pixel, and a region DA in the pixel defining layer is the region for display in the corresponding pixel.

The material for forming the pixel defining layer is usually photoresist. The pattern of the pixel defining layer is generally formed by using a photolithography process in prior art, and the mask plate used for patterning is generally a mask plate specifically designed for the pixel defining layer. Meanwhile, during photolithography, one positioning process is required for precise positioning of the mask plate so as to form the pixel defining layer accurately.

As can be seen from the above, upon production of the pixel defining layer in prior art, a specific mask plate is required and one positioning process is required, and therefore the producing flow is relatively complex and the production costs are relatively high; moreover, because one positioning process is required, yield of display panels can be affected by precision of the positioning.

SUMMARY

According to embodiments of the invention, there are provided an organic light emitting diode display panel and a method for manufacturing the same, which are capable of simplifying producing flow of the display panel, decreasing production costs of the display panel, and increasing yield of the organic light emitting diode display panel.

According to one aspect of the present invention, there is provided a method for manufacturing a pixel defining layer of an organic light emitting diode display panel, comprising:

coating a photoresist layer on a transparent substrate with an active array formed thereon so as to cover the active array, the active array comprising driving power lines, data lines, scan lines, and a plurality of pixel units which are defined by crossing of the scan lines and the data lines, the pixel units comprising first electrodes which are transparent, wherein the scan lines and at least one kind of lines of the data lines and the driving power lines are opaque;

performing exposure on the photoresist layer from one side of the transparent substrate opposed to the photoresist layer, wherein the scan lines and the at least one kind of lines are used as a mask plate to prevent exposure of the corresponding photoresist, so that a photoresist remaining region is formed by the photoresist layer; and conducting a development treatment on the photoresist layer, so that the photoresist outside the photoresist remaining region is removed and the photoresist in the photoresist remaining region is retained to form the pixel defining layer.

For example, in the above method, the pixel defining layer comprises a first pixel defining layer formed of the photoresist in the photoresist remaining region, and further comprises a second pixel defining layer.

For example, before coating of the photoresist layer, a hydrophilic material layer is formed on the transparent substrate with a material which is transparent and has hydrophilicity. The photoresist layer comprises a hydrophobic material and is coated on the hydrophilic material layer. After the development treatment, the hydrophilic material layer exposed outside the photoresist remaining region is further removed, and a second pixel defining layer constituted by the remaining hydrophilic material layer is obtained.

For example, in the above method, the material for the second pixel defining layer is silicon nitride, and the material for the first pixel defining layer is polyimide.

According to another aspect of the present invention, there is provided a method for manufacturing an organic light emitting diode display panel, comprising:

forming an active array on a transparent substrate, the active array comprising driving power lines, data lines, scan lines, and a plurality of pixel units which are defined by crossing of the scan lines and the data lines, the pixel units comprising first electrodes which are transparent, wherein the scan lines and at least one kind of lines of the data lines and the driving power lines are opaque;

coating a photoresist layer on the transparent substrate;

performing exposure on the photoresist layer from one side of the transparent substrate opposed to the photoresist layer, wherein the scan lines and the at least one kind of lines are used as a mask to prevent exposure of the corresponding photoresist, so that a photoresist remaining region is formed by the photoresist layer;

conducting a development treatment on the photoresist layer, so that the photoresist outside the photoresist remaining region is removed and the photoresist in the photoresist remaining region is retained to form a pixel defining layer;

forming an organic light emitting layer in a pixel region defined by the pixel defining layer; and forming a second electrode on the organic light emitting layer.

For example, in the above method, the pixel defining layer comprises a first pixel defining layer formed of the photoresist in the photoresist remaining region, and further comprises a second pixel defining layer.

For example, before coating of the photoresist layer, a hydrophilic material layer is formed on the transparent substrate with a material which is transparent and has hydrophilicity. The photoresist layer comprises a hydrophobic material and is coated on the hydrophilic material layer. After the development treatment, the hydrophilic material layer exposed outside the photoresist remaining region is further removed, and a second pixel defining layer constituted by the remaining hydrophilic material layer is obtained.

For example, in the above method, the material for the second pixel defining layer is silicon nitride, and the material for the first pixel defining layer is polyimide.

For example, in the above method, the first electrodes are anodes, and the second electrode is a cathode.

According to still another aspect of the invention, there is provided an organic light emitting diode display panel, which is manufactured by the above method.

As can be seen from the above, regarding the organic light emitting diode display panel and the method for manufacturing the same provided by embodiments of the invention, in a photolithograph process for forming the pixel defining layer, the scan lines and the data lines (or the driving power lines) which are opaque function as a mask plate, so that a specific mask plate is no longer required and moreover a mask positioning process in prior art is also saved. Thus, it is possible that the producing flow is largely simplified, production costs are decreased and yield of products is increased.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the accompanying drawings of the embodiments of the invention. It is obvious that the described embodiments are just a part but not all of the embodiments of the invention. Based on the described embodiments of the invention, those ordinarily skilled in the art can obtain other embodiment(s), without any inventive work, which should fall within the scope sought for protection by the invention.

In an OLED display panel according to an embodiment of the invention, fabrication of a pixel defining layer is carried out after fabrication of an active array and anodes of pixels is completed and before an organic light emitting layer is formed. The active array comprises switch transistors functioning as switch elements of pixels, driving transistors for driving OLEDs, connecting lines between the switch transistors and the driving transistors, scan lines, data lines, driving lines, etc.

Figure 1:
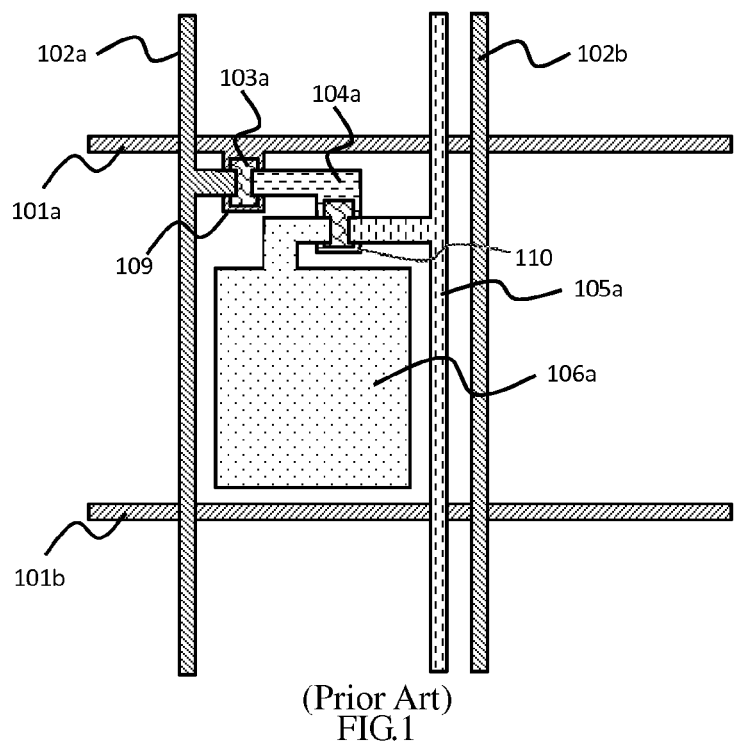
FIG. 1 is a structurally schematic view showing an active-region pixel prior to fabrication of a pixel defining layer in prior art.
Figure 2:
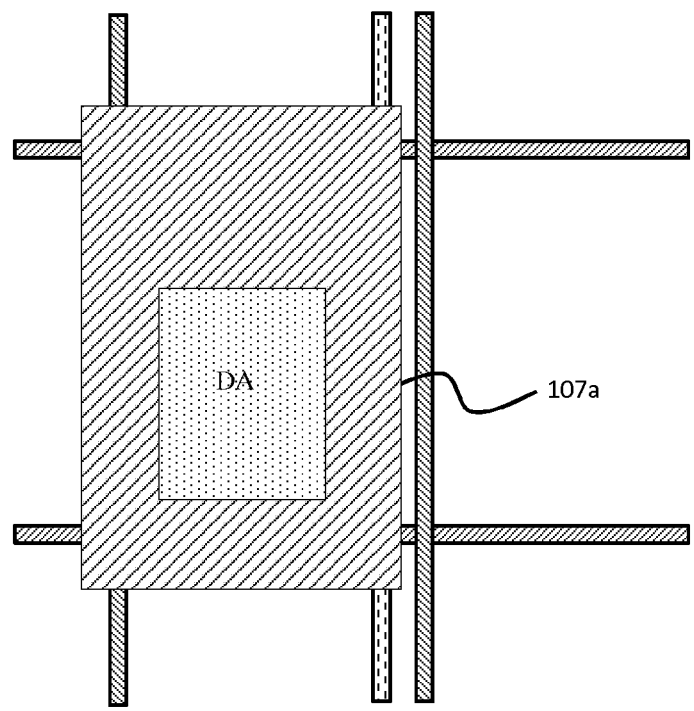
FIG. 2 is a structurally schematic view showing the pixel defining layer in prior art.

Regarding a conventional pixel defining layer, a specifically designed mask plate is generally used for patterning of the pixel defining layer. However, embodiments of the invention do not need a specialized pixel-defining-layer mask plate. Fabrication of the active array has already been completed prior to fabrication of the pixel defining layer, and the scan lines, the data lines, the driving power lines, etc. have already been formed on a substrate. Such a structure is, for example, the structure as shown in FIG. 1.

In the array substrate according to an embodiment of the invention, the scan lines and the data lines are disposed so as to cross each other, for example, the scan lines and the data lines may be disposed perpendicular to each other; the data lines and the driving power lines are usually parallel to each other, and the scan lines and the data lines (or the driving power lines), perpendicular to each other, separate each pixel from each other. According to the embodiment of the invention, these data lines function as a mask plate for the pixel defining layer, with which the pixel defining layer is patterned, so that a specific mask plate and a positioning process are no longer required.

Figure 3:
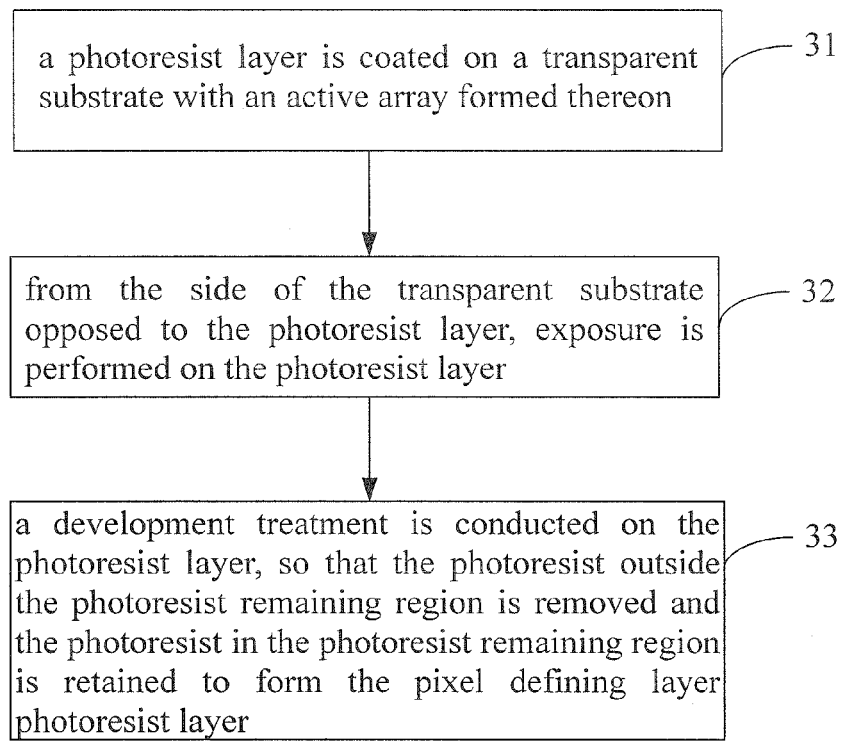
FIG. 3 is a schematic view showing a manufacturing flow of a pixel defining layer provided in an embodiment of the invention.

Please referring to FIG. 3, a method for manufacturing a pixel defining layer of an organic light emitting diode display panel according to an embodiment of the invention may comprises the following steps.

Step 31, a photoresist layer is coated on a transparent substrate with an active array formed thereon, the active array comprising driving power lines, data lines, scan lines, and a plurality of pixel units which are defined by crossing of the scan lines and the data lines, the pixel units comprising first electrodes which are transparent, wherein the scan lines and at least one kind of lines of the data lines and the driving power lines are opaque.

The photoresist is coated on the surface of the active array on the transparent substrate to cover the active array.

Here, a substrate, such as a glass substrate, a quartz substrate, a plastic substrate or the like, can be used for the transparent substrate. The scan lines are opaque; and the driving power lines and the data lines may be both opaque; alternatively, only one of them is transparent. For example, the driving power lines are opaque while the data lines are transparent; or, the data lines are opaque while the driving power lines are transparent. Regarding the structure shown in FIG. 1, for each pixel, the driving power line 105 is closer to the transparent electrode 106a compared to the data line 102b, and thus the driving power line 105 is preferably opaque.

The above scan lines/driving power lines/data lines, which are opaque, can be formed with a lighttight conductive material, such as Mo, Al, Ti, or the like.

As such, due to existence of the opaque scan lines and the driving power lines and/or data lines, which cross the scan lines and are opaque, a plurality of pixel units can be defined by such crossing. For example, scan lines and data lines, which are perpendicular to each other and are both opaque, cross each other and define a plurality of pixel units.

As shown in FIG. 1, each of the pixel units may specifically include a first electrode (for example an ITO anode) 106a which is transparent, and may further include a switch transistor 109, a driving transistor 110 or other transistor device(s). However, in the embodiment of the invention, the specific connection relationship between the switch transistor, the driving transistor, the scan line, the data line and the driving power line is not limited, and may be a known structure (for example the structure shown in FIG. 1) or a structure that will be developed in future, therefore its details being omitted here.

Step 32, from the side of the transparent substrate opposed to the photoresist layer, exposure is performed on the photoresist layer, wherein the scan lines and the at least one kind of lines are used as a mask plate to prevent exposure of the photoresist in correspondence with them, so that a photoresist remaining region can be formed with the photoresist layer.

Here, the exposure is conducted from the side of the transparent substrate without the coated photoresist, and thereby the corresponding photoresist is sheltered by utilizing the opaque characteristic of the data lines and the driving power lines (and/or the data lines) so as to avoid it from being exposed. Thus, the photoresist that has not been exposed forms the photoresist remaining region, and the remaining region will be retained after development.

Step 33, a development treatment is conducted on the photoresist layer, so that the photoresist outside the photoresist remaining region is removed and the photoresist in the photoresist remaining region is retained to form the pixel defining layer.

Here, through the development treatment, the part of the photoresist which is not sheltered during exposure will be removed and the photoresist layer in the photoresist remaining region will be retained, so that the retained photoresist forms a specific structure of the pixel defining layer.

As can be seen, in a photolithograph process for forming the pixel defining layer according to the embodiment, the scan lines and the data lines (or the driving power lines) which are opaque are used as a mask plate, so that a specific mask plate is no longer required and moreover a mask positioning process in prior art can be reduced. Thus, it is possible that the producing flow can be greatly simplified, production costs are decreased, and yield of products is increased.

In the embodiments of the invention, the pixel defining layer may be in a one-layered or two-layered structure, and may also be a compound hierarchy structure comprising a plurality of layers. For example, when a two-layered structure is adopted, different hydrophilic materials may be used, and the material close to the first electrode, which is transparent, is transparent. In this case, a method for manufacturing a pixel defining layer of an organic light emitting diode display panel according to an embodiment of the invention may includes the following steps.

Step 41, with a material which is transparent and has hydrophilicity, a hydrophilic material layer is formed on a transparent substrate with an active array formed thereon.

Here, the active array comprises driving power lines, data lines, scan lines, and a plurality of pixel units which are defined by crossing of the scan lines and the data lines, and the pixel units comprises first electrodes which are transparent, wherein the scan lines and at least one kind of lines of the data lines and the driving power lines are opaque. Silicon nitride may be specifically used for the hydrophilic material layer, and therefore the hydrophilic material layer can be obtained by covering a layer of silicon nitride on the surface of the active array of the transparent substrate by way of chemical deposition.

Step 42, a photoresist layer is coated on the hydrophilic material layer.

Step 43, from the side of the transparent substrate opposed to the photoresist layer, exposure is performed on the photoresist layer, wherein the scan lines and the at least one kind of lines are used as a mask plate to prevent exposure of the photoresist in correspondence with them, so that a photoresist remaining region is formed by the photoresist layer.

Step 44, a development treatment is conducted on the photoresist layer, so that the photoresist outside the photoresist remaining region is removed and the photoresist in the photoresist remaining region is retained to form a first pixel defining layer.

Step 45, the hydrophilic material layer outside the photoresist remaining region is removed, and a second pixel defining layer constituted by the remaining hydrophilic material layer is obtained. For example, this step is performed by using wet etching or dry etching with the formed first pixel defining layer as an etching mask.

The resulted pixel defining layer through the above treatments has a two-layered structure, which comprises the first pixel defining layer formed by the photoresist in the photoresist remaining region and further comprises the second pixel defining layer constituted by the remaining hydrophilic material layer, where the first pixel defining layer is located over the second pixel defining layer. Silicon nitride can be used as the material for the second pixel defining layer in the underlying layer, and polyimide can be used as the material for the first pixel defining layer in the upper layer. Silicon nitride is hydrophilic while polyimide is hydrophobic. This structure will be helpful to form a desired thickness distribution for a hole transportation layer, a hole injection layer or a light emitting layer of an organic light emitting device in subsequent procedures.

After coating of the materials of two layers for the pixel defining layer is completed, an exposure and development treatment is performed in such a way as the above steps 44~45, and then etching, stripping-off and other process(es) are performed on materials, thereby completing patterning of the double-layered pixel defining layer.

Figure 4:
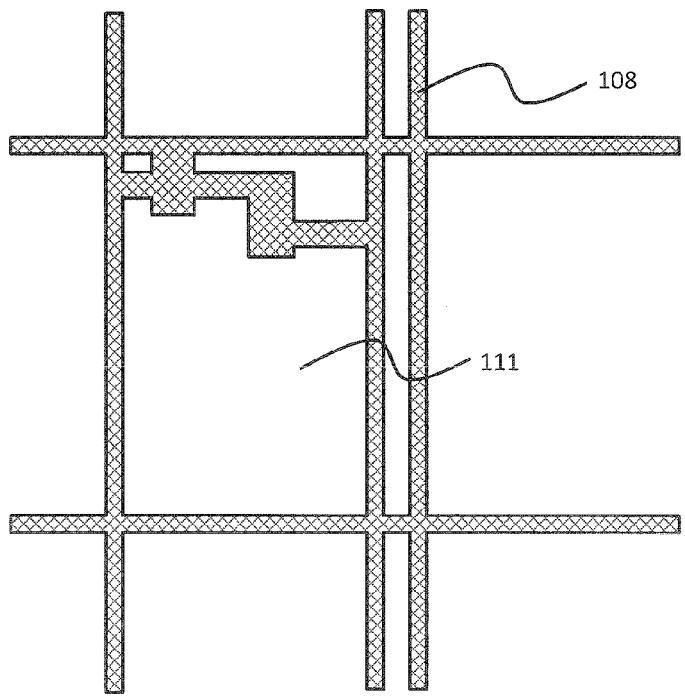
FIG. 4 is a structurally schematic view showing the pixel defining layer formed in the embodiment of the invention.

With the above method according to the embodiment, the pixel defining layer is patterned with the lighttight metal lines in FIG. 1 (such as scan lines, data lines, driving power lines) as an exposure mask plate. Provided that the metal lines and devices which are lighttight in FIG. 1 include the scan lines 101~101b, the data lines 102a~102b, the driving power lines 105a, the connecting lines 104a as well as the switch transistors 109 and the driving transistors 110 (i.e., they are all made of an opaque, conductive material). The pattern constituted by these metal lines and devices, which are opaque, is collectively denoted by 108 in FIG. 4. In this example, the pattern 108 as shown in FIG. 4 is used as a mask plate, and after coating of the materials for the pixel defining layer, exposure is performed from the backside of the substrate. The photoresist over the part of the pattern 108 in FIG. 4 is not exposed and will be left on the substrate after development, while those parts that lie outside of the pattern 108 are exposed and the photoresist will be removed after development. In such a way, the pixel defining layer in the same shape as the pattern 108 is formed on the substrate. In the shape of the pattern 108, there is a larger closed space 111 where the first electrode which is transparent is located, and the organic light emitting layer can be formed over the first electrode in the closed space. Thus, the whole area of the first electrode which is transparent can be used for display, and accordingly, the pixel unit can be fully utilized.

Application of the invention to fabrication of organic light emitting diode display panels will be further introduced below. Please referring to FIG. 5, and according to an embodiment of the invention, there is provided a method for manufacturing an organic light emitting diode display panel which comprises the following steps.

Step 51, an active array is formed on a transparent substrate, the active array comprising driving power lines, data lines, scan lines, and a plurality of pixel units which are defined by crossing of the scan lines and the data lines, and the pixel units comprising first electrodes which are transparent, wherein the scan lines and at least one kind of lines of the data lines and the driving power lines are opaque.

Here, the pixel units may further include driving transistors, switch transistors and connecting lines between the driving transistors and the switch transistors. In the present invention, the specific connection relationship between the switch transistors, the driving transistors, the scan lines, the data lines and the driving power lines is not limited, and may be a known structure or a structure that will be developed in future, its details being omitted here. Moreover, material, forming process and so on regarding the transparent substrate, the driving power lines, the data lines, the scan lines, the transistors, etc. may be the same as those stated above, and thus will no longer be detailed here.

Step 52, a photoresist layer is coated on the transparent substrate. The photoresist is coated on the surface of the active array so as to cover the active array.

Step 53, from the side of the transparent substrate opposed to the photoresist layer, exposure is performed on the photoresist layer, wherein the scan lines and the at least one kind of lines is used as a mask plate to prevent exposure of the photoresist in correspondence with them, so that a photoresist remaining region is formed by the photoresist layer.

Step 54, a development treatment is conducted on the photoresist layer, so that the photoresist outside the photoresist remaining region is removed and the photoresist in the photoresist remaining region is retained to form a pixel defining layer.

Step 55, an organic light emitting layer is formed in a pixel region defined by the pixel defining layer.

Step 56, a second electrode is formed on the organic light emitting layer.

Here, the first electrodes may be anodes, and the second electrode may be a cathode. The first electrodes are made of a transparent, conductive material, and the second electrode can be made of a conductive material which is transparent or opaque.

In the step 55, the organic light emitting layer can be formed on the substrate through evaporation with a mask plate, or can be formed by means of ink printing.

Of course, the processes in the steps 41~45 may also be adopted here to form a pixel defining layer of a two-layered structure. Details are omitted here.

In the embodiment of the invention, upon formation of the organic light emitting layer, even if the organic light emitting layer is deposited in other regions than the first electrodes in the pixel region, because only first electrodes (such as anode electrodes) in the pixel region may contact with the organic light emitting material, the other regions will not emit light after energizing despite the fact that the organic light emitting material which does not contact the first electrodes is present in these regions. Therefore, for simplifying the process, in the embodiment, the mask may not be used in the step 55 and the organic light emitting layer can be directly formed on the substrate through evaporation.

Figure 5:
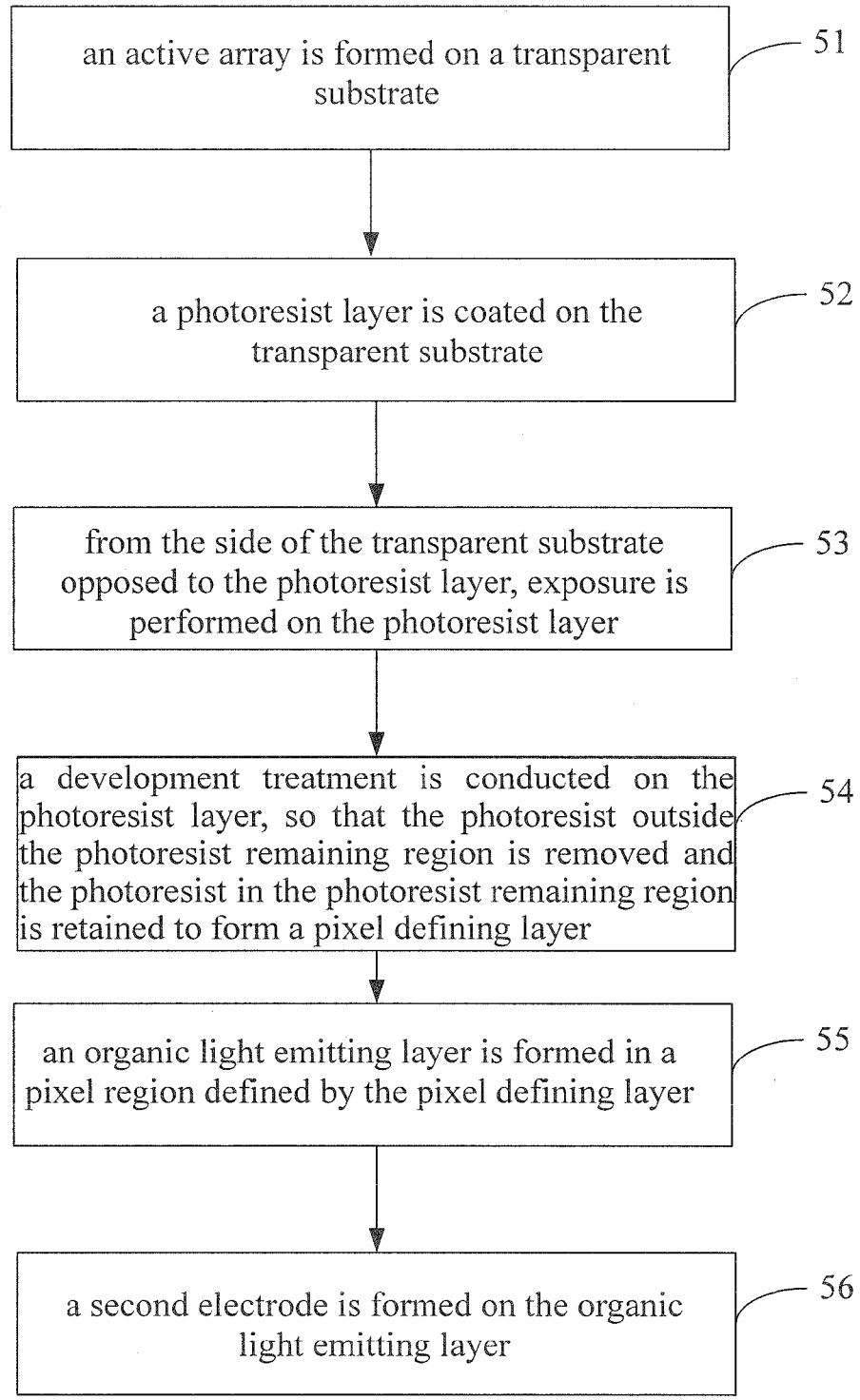
FIG. 5 is a schematic view showing a manufacturing flow of an organic light emitting diode display panel provided in an embodiment of the invention.

Finally, according to the embodiment of the invention, there are further provided an organic light emitting display panel and its pixel defining layer; the organic light emitting display panel is manufactured by using the method shown in FIG. 5, and the pixel defining layer is manufactured by using the method shown in FIG. 3, their details being omitted here.

The foregoing are merely embodiments of the present invention. It will be noted that, a number of improvements and modifications can further be made by those ordinarily skilled in the art without departing from the principle of the invention, and these improvements and modifications should also fall into the protection scope of the invention.

The invention claimed is:

1. A method for manufacturing a pixel defining layer of an organic light emitting diode display panel, comprising:
    coating a photoresist layer on a transparent substrate with an active array formed thereon so as to cover the active array, the active array comprising driving power lines, data lines, scan lines, and a plurality of pixel units which are defined by crossing of the scan lines and the data lines, the pixel units comprising first electrodes which are transparent, wherein the scan lines and at least one kind of lines of the data lines and the driving power lines are opaque;
    performing exposure on the photoresist layer from one side of the transparent substrate opposed to the photoresist layer, wherein the scan lines and the at least one kind of lines are used as a mask plate to prevent the corresponding photoresist from being exposed, so that a photoresist remaining region is formed by the photoresist layer; and
    conducting a development treatment on the photoresist layer, so that the photoresist outside the photoresist remaining region is removed and the photoresist in the photoresist remaining region is retained to form the pixel defining layer, wherein the pixel defining layer comprises:
        a first pixel defining layer formed of the photoresist in the photoresist remaining region, and
        a second pixel defining layer being an inorganic material and being formed under the first pixel defining layer.

2. The method claimed as claim 1, wherein the material for the second pixel defining layer is silicon nitride, and the material for the first pixel defining layer is polyimide.

3. The method claimed as claim 1, wherein before coating of the photoresist layer, a hydrophilic material layer is formed on the transparent substrate with a material which is transparent and has hydrophilicity;
    the photoresist layer comprises a hydrophobic material and is coated on the hydrophilic material layer;
    after the development treatment, the hydrophilic material layer exposed outside the photoresist remaining region is further removed, and the second pixel defining layer constituted by the remaining hydrophilic material layer is obtained.

4. The method claimed as claim 3, wherein the material for the second pixel defining layer is silicon nitride, and the material for the first pixel defining layer is polyimide.

5. A method for manufacturing an organic light emitting diode display panel, comprising:
    forming an active array on a transparent substrate, the active array comprising driving power lines, data lines, scan lines, and a plurality of pixel units which are defined by crossing of the scan lines and the data lines, the pixel units comprising first electrodes which are transparent, wherein the scan lines and at least one kind of lines of the data lines and the driving power lines are opaque;

coating a photoresist layer on the transparent substrate so as to cover the active array;

performing exposure on the photoresist layer from one side of the transparent substrate opposed to the photoresist layer, wherein the scan lines and the at least one kind of lines are used as a mask plate to prevent exposure of the corresponding photoresist, so that a photoresist remaining region is formed by the photoresist layer;

conducting a development treatment on the photoresist layer, so that the photoresist outside the photoresist remaining region is removed and the photoresist in the photoresist remaining region is retained to form a pixel defining layer;

forming an organic light emitting layer in a pixel region defined by the pixel defining layer; and forming a second electrode on the organic light emitting layer, wherein the pixel defining layer comprises:

a first pixel defining layer formed of the photoresist in the photoresist remaining region, and a second pixel defining layer being an inorganic material and being formed under the first pixel defining layer.

6. The method claimed as claim 5, wherein the material for the second pixel defining layer is silicon nitride, and the material for the first pixel defining layer is polyimide.

7. The method claimed as claim 5, wherein the first electrodes are anodes, and the second electrode is a cathode.

8. The method claimed as claim 5, wherein before coating of the photoresist layer, a hydrophilic material layer is formed on the transparent substrate with a material which is transparent and has hydrophilicity;

the photoresist layer comprises a hydrophobic material and is coated on the hydrophilic material layer;

after the development treatment, the hydrophilic material layer exposed outside the photoresist remaining region is further removed, and the second pixel defining layer constituted by the remaining hydrophilic material layer is obtained.

9. The method claimed as claim 8, wherein the material for the second pixel defining layer is silicon nitride, and the material for the first pixel defining layer is polyimide.

* * * * *